US008692794B2

(12) United States Patent
Fang (10) Patent No.: US 8,692,794 B2
(45) Date of Patent: Apr. 8, 2014

(54) INPUT DEVICE TRANSMITTER PATH ERROR DIAGNOSIS

(75) Inventor: Wen Fang, Fremont, CA (US)

(73) Assignee: Synaptics Incorporated, San Jose, CA (US)

( * ) Notice: Subject to any disclaimer, the term of this patent is extended or adjusted under 35 U.S.C. 154(b) by 238 days.

(21) Appl. No.: 13/012,943

(22) Filed: Jan. 25, 2011

(65) Prior Publication Data

US 2012/0188195 A1 Jul. 26, 2012

(51) Int. Cl.
*G06F 3/045* (2006.01)

(52) U.S. Cl.
USPC .......................................................... 345/174

(58) Field of Classification Search
None
See application file for complete search history.

(56) References Cited

U.S. PATENT DOCUMENTS

| | | | |
|---|---|---|---|
| 6,104,198 | A | 8/2000 | Brooks |
| 7,057,395 | B1 | 6/2006 | Williamson |
| 7,916,127 | B2 | 3/2011 | Wang |
| 8,253,425 | B2 | 8/2012 | Reynolds et al. |
| 8,258,797 | B2 | 9/2012 | Shahparnia et al. |
| 8,519,722 | B1 | 8/2013 | Prendergast |
| 2005/0040839 | A1 | 2/2005 | Neaves et al. |
| 2006/0197539 | A1 | 9/2006 | Schneider et al. |
| 2007/0030408 | A1 | 2/2007 | Lin et al. |
| 2007/0115004 | A1 | 5/2007 | Mirov et al. |
| 2007/0200831 | A1* | 8/2007 | Wang ............................ 345/173 |
| 2008/0157782 | A1 | 7/2008 | Krah |
| 2008/0278453 | A1* | 11/2008 | Reynolds et al. ............. 345/173 |
| 2009/0250268 | A1 | 10/2009 | Staton et al. |
| 2012/0050229 | A1 | 3/2012 | Tenuta et al. |
| 2012/0092279 | A1* | 4/2012 | Martin ........................... 345/173 |

OTHER PUBLICATIONS

Chung, You C., et al., "Capacitance and Inductance Sensors for Location of Open and Short Circuited Wires", http://www.ece.utah.edu/~ece3300/Labs/lab/Timer_diff_capacitance_sensor_IEEEinstrumentation.pdf. (Aug. 2009), 1-26.
Borshchov, V, et al., "Aluminium Microcable Technology for the Alice Silicon Strip Detector: A Status Report", *8th Workshop on Electronics for LHC Experiments*, Colmar, France, (Sep. 2002), 144-149.
"Office Action, U.S. Appl. No. 13/012,943 mailed Jul. 5, 2013, 37 pages".
Notice of Allowance for U.S. Appl. No. 13/028,876, Mailed Nov. 8, 2013, 19 pages.

\* cited by examiner

*Primary Examiner* — Joe H Cheng
*Assistant Examiner* — Kwin Xie (57) ABSTRACT

A processing system configured for capacitive sensing comprises transmitter circuitry, a first internal diagnostic mechanism, and a determination module. The transmitter circuitry is configured to transmit during a first time period with a first transmitter path of a plurality of transmitter paths in an input device. Each transmitter path of the plurality of transmitter paths is configured for capacitive sensing. The first internal diagnostic mechanism comprises a selectable leakage path. The selectable leakage path is configured to be coupled with the transmitter circuitry. The determination module is configured to determine if a discontinuity exists within the first transmitter path based on a discharge rate for the first transmitter path. The discharge rate is acquired during a second time period via the selectable leakage path of the first internal diagnostic mechanism, wherein the second time period occurs after the first time period.

19 Claims, 9 Drawing Sheets

TRANSMIT DURING A FIRST TIME PERIOD WITH A FIRST TRANSMITTER PATH OF A PLURALITY OF TRANSMITTER PATHS IN AN INPUT DEVICE, WHEREIN EACH TRANSMITTER PATH OF THE PLURALITY OF TRANSMITTER PATHS IS CONFIGURED FOR CAPACITIVE SENSING.
510

ENABLE A SELECTABLE LEAKAGE PATH OF AN INTERNAL DIAGNOSTIC MECHANISM OF THE PROCESSING SYSTEM DURING A SECOND TIME PERIOD.
520

DETERMINE IF A DISCONTINUITY EXISTS WITHIN THE FIRST TRANSMITTER PATH BASED ON A DISCHARGE RATE FOR THE FIRST TRANSMITTER PATH, WHEREIN THE DISCHARGE RATE IS ACQUIRED DURING A SECOND TIME PERIOD VIA THE SELECTABLE LEAKAGE PATH OF THE INTERNAL DIAGNOSTIC MECHANISM OF A PROCESSING SYSTEM OF THE INPUT DEVICE, WHEREIN THE SECOND TIME PERIOD OCCURS AFTER THE FIRST TIME PERIOD.
530

INPUT DEVICE TRANSMITTER PATH ERROR DIAGNOSIS

BACKGROUND

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

SUMMARY

A processing system configured for capacitive sensing comprises transmitter circuitry, a first internal diagnostic mechanism, and a determination module. The transmitter circuitry is configured to transmit during a first time period with a first transmitter path of a plurality of transmitter paths in an input device. Each transmitter path of the plurality of transmitter paths is configured for capacitive sensing. The first internal diagnostic mechanism comprises a selectable leakage path. The selectable leakage path is configured to be coupled with the transmitter circuitry. The determination module is configured to determine if a discontinuity exists within the first transmitter path based on a discharge rate for the first transmitter path. The discharge rate is acquired during a second time period via the selectable leakage path of the first internal diagnostic mechanism, wherein the second time period occurs after the first time period.

BRIEF DESCRIPTION OF DRAWINGS

The drawings referred to in this Brief Description of Drawings should not be understood as being drawn to scale unless specifically noted. The accompanying drawings, which are incorporated in and form a part of the Description of Embodiments, illustrate various embodiments of the present invention and, together with the Description of Embodiments, serve to explain principles discussed below, where like designations denote like elements, and.

DESCRIPTION OF EMBODIMENTS

The following Description of Embodiments is merely provided by way of example and not of limitation. Furthermore, there is no intention to be bound by any expressed or implied theory presented in the preceding background or brief summary, or in the following detailed description.

Overview of Discussion

Herein, various embodiments are described that provide input devices and methods that facilitate improved usability. In various embodiments described herein, the input device may be a capacitive sensing device.

Discussion begins with a description of an example input device with which or upon which various embodiments described herein may be implemented. An example processing system and components thereof are then described. The processing system may be utilized with an input device such as the capacitive sensing device, or with some other device/system. Operation of the processing system and its components are further described in conjunction with description of an example method of input device transmission error diagnosis.

Example Input Device

Figure 1A:
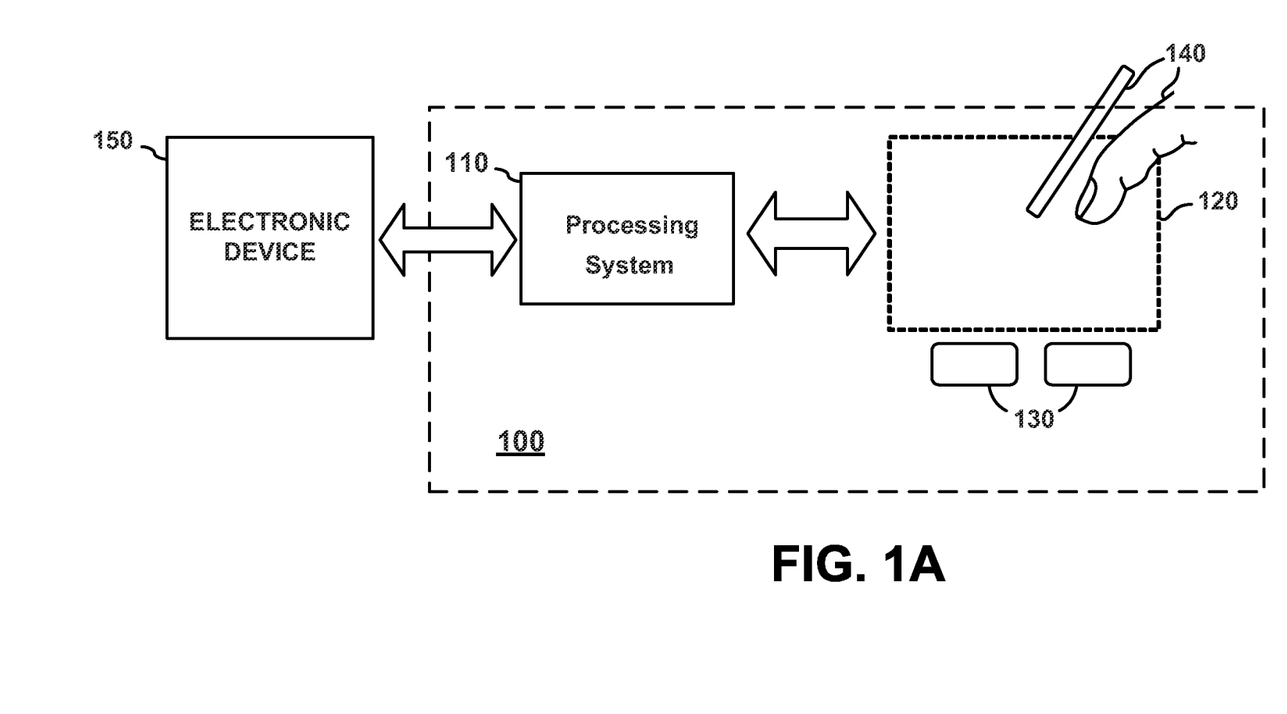
FIG. 1A is a block diagram of an example input device, in accordance with embodiments.

FIG. 1A is a block diagram of an example input device 100, in accordance with embodiments of the invention. The input device 100 may be configured to provide input to an electronic device 150. The input device 100 may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system, or can be physically separate from the electronic system. As appropriate, the input device 100 may communicate with parts of the electronic system using any one or more of the following: buses, networks, and other wired or wireless interconnections. Examples include, but are not limited to: Inter-Integrated Circuit ($I^2C$), Serial Peripheral interface (SPI), Personal System 2 (PS/2), Universal Serial Bus (USB), Bluetooth®, Radio Frequency (RF), and Infrared Data Association (IrDA).

In FIG. 1A, input device 100 is shown as a proximity sensor device (also often referred to as a "touchpad" or a "touch sensor device") configured to sense input provided by one or more input objects 140 in a sensing region 120. Some example input objects include fingers and styli, as shown in FIG. 1A.

Sensing region 120 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g. a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100.

The input device 100 may utilize any combination of sensor components and sensing technologies to detect user input in the sensing region 120. The input device 100 comprises one or more sensing elements for detecting user input. As several non-limiting examples, the input device 100 may use capacitive, elastive, resistive, inductive, magnetic acoustic, ultrasonic, and/or optical techniques.

Some implementations are configured to provide images that span one, two, three, or higher dimensional spaces. Some implementations are configured to provide projections of input along particular axes or planes.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g. system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals comprising response(s) corresponding to the transmitter signal(s). Sensor electrodes may be dedicated transmitters or receivers, or may be configured to both transmit and receive.

In FIG. 1A, a processing system 110 is shown as part of the input device 100. The processing system 110 is configured to operate the hardware of the input device 100 to detect input in the sensing region 120. The processing system 110 comprises parts of or all of one or more integrated circuits (ICs) and/or other circuitry components. (For example, a processing system for a mutual capacitance sensor device may comprise transmitter circuitry configured to transmit signals with transmitter sensor electrodes, and/or receiver circuitry configured to receive signals with receiver sensor electrodes). In some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100, and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g. to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1A shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of an active area of a display screen. For example, the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display screen may share physical elements. For example, some embodiments may utilize some of the same electrical components for displaying and sensing. As another example, the display screen may be operated in part or in total by the processing system 110.

It should be understood that while many embodiments of the present invention are described in the context of a fully functioning apparatus, the mechanisms of the present invention are capable of being distributed as a program product (e.g., software) in a variety of forms. For example, the mechanisms of the present invention may be implemented and distributed as a software program on information bearing media that are readable by electronic processors (e.g., non-transitory computer-readable and/or recordable/writable information bearing media readable by the processing system 110). Additionally, the embodiments of the present invention apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 1B:
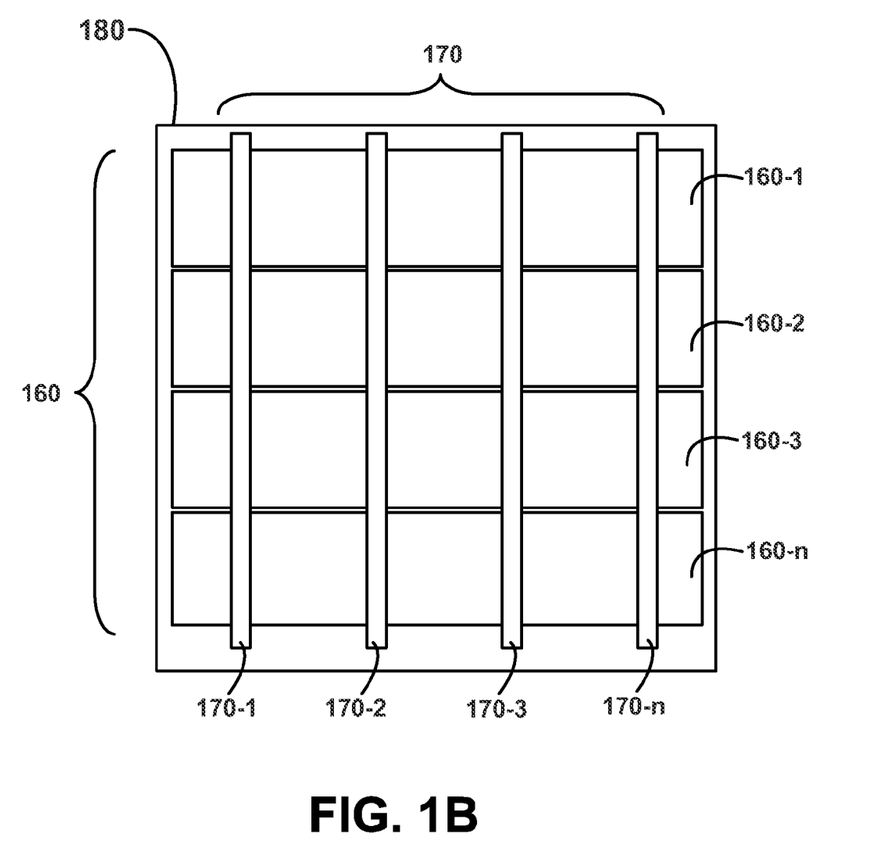
FIG. 1B shows a portion of an example sensor electrode pattern which may be utilized to generate all or part of the sensing region of an input device, according to an embodiment.

FIG. 1B shows a portion of an example sensor electrode pattern which may be disposed to generate all or part of the sensing region of an input device, according to an embodiment. For purposes of clarity of illustration and description, a simple rectangular pattern is illustrated, though it is appreciated that other patterns may be employed. The sensing pattern is made up of a plurality of receiver electrodes 170 (170-1, 170-2, 170-3, . . . 170-n) and a plurality of transmitter electrodes 160 (160-1, 160-2, 160-3, . . . 160-n) which overlay one another and are disposed on a substrate 180. In this example, touch sensing pixels are centered at locations where transmitter and receiver electrodes cross. It is appreciated that some form of insulating material is typically disposed between transmitter electrodes 160 and receiver electrodes 170. In one embodiment, transmitter electrodes 160 (160-1, 160-2, 160-3, . . . 160-n) and receiver electrodes 170 (170-1, 170-2, 170-3, . . . 170-n) may be disposed on a similar layer, where the transmitter electrode comprise a plurality of jumpers disposed on a second layer. In various embodiments, touch sensing includes sensing input objects anywhere in sensing region 120 and may comprise: no contact with any surfaces of the input device 100, contact with an input surface (e.g., a touch surface) of the input device 100, contact with an input surface of the input device 100 coupled with some amount of applied force or pressure, and/or a combination thereof.

Figure 1C:
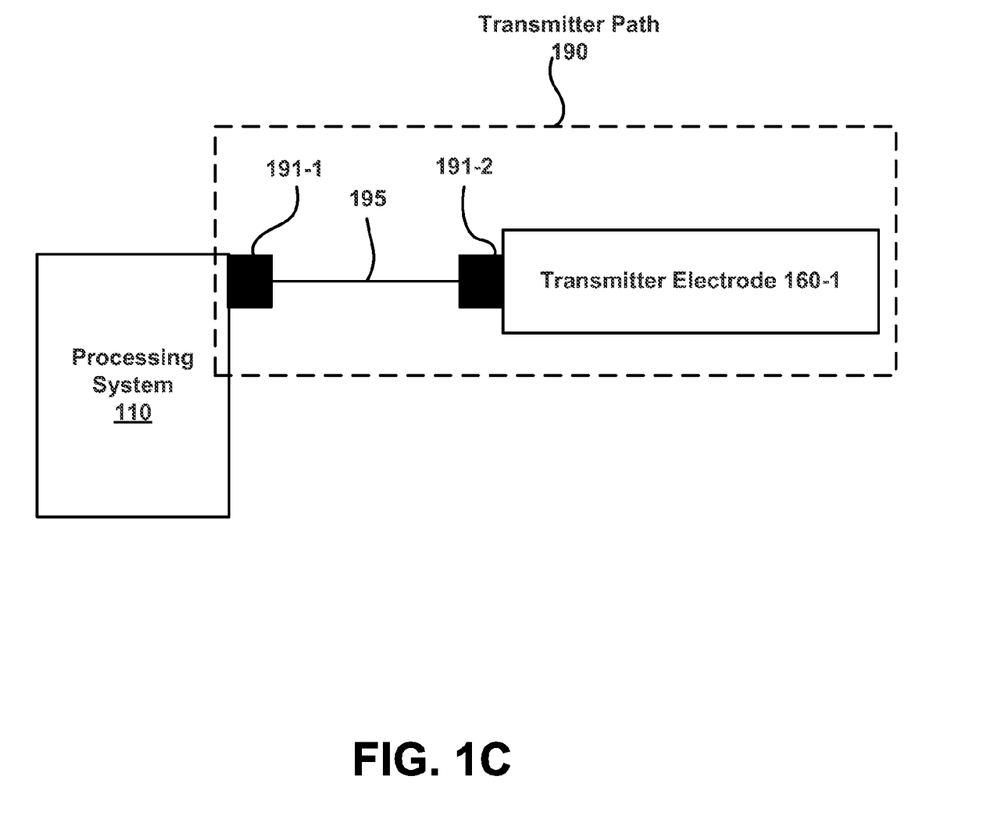
FIG. 1C shows an example of a transmitter path, according to various embodiments.

FIG. 1C shows an example of a transmitter path 190, according to various embodiments. FIG. 1C shows processing system 110 coupled with trace 195 via connection 191-1 and trace 195 coupled with transmitter electrode 160-1 via connection 191-2. Herein, at its longest, a transmitter electrode along with a totality of the electrical pathway which couples the transmitter electrode to transmitter circuitry in a processor is considered to be a transmitter path. However, in some embodiments, such as when a transmitter path error exists or when an input device is only partially assembled, a transmitter path may be shortened and/or include fewer components. Thus, as illustrated by FIG. 1C, transmitter path 190 may comprise a transmitter electrode (e.g., 160-1), connections 191-1 and 191-2 and trace 195. In one embodiment, a transmitter path includes connection 191-1 and trace 195. In another embodiment, a transmitter path includes connection 191-1, trace 195 and connection 191-2. In yet a further embodiment, a transmitter path includes connection 191-1, trace 195, connection 191-2 and transmitter electrode 160-1. In other embodiments, the transmitter path may include other traces and connections. For example, in one embodiment, connection 191-2 may couple trace 195 with another trace, where that trace is then coupled with transmitter electrode 160-1 through another connection. In such embodiment, transmitter path 190 may include one or more of any trace, connection and transmitter electrode. Connection 191-1 and connection 191-2 include hot bar connections, zero insertion force connections, bonding pads, and sensor channels. In other embodiment, connections 191-1 and 191-2 include any device able to couple traces 150 with processing system 110 or transmitter electrode 160-1.

In other embodiments, plurality of transmitter electrodes 160 and plurality of receiver electrodes 170 are coupled to processing system 110 though a plurality of traces, where each transmitter electrode and receiver electrode is coupled to processing system 110 through a different trace. Further, in some embodiments, plurality of transmitter electrodes 160 is coupled with a first plurality of traces, where the plurality of transmitter electrodes 160 and the first plurality of traces are disposed on substrate 180. A connection device, comprising a second plurality of traces, couples processing system 110 with a transmitter electrode of plurality of transmitter electrodes 160 by coupling a trace of the first plurality of traces with a corresponding trace of the second plurality of traces. Each of the second plurality of traces is then coupled with a different connection of processing system 110. In such an example, a transmitter path may include at least one of a transmitter electrode, a corresponding trace of the first plurality of traces, a corresponding trace of the second plurality of traces, any connection between corresponding traces, any connection between the transmitter electrode and corresponding traces, and the connection between the corresponding trace of the second plurality of traces and the transmitter circuitry of processing system 110.

Figure 2A:
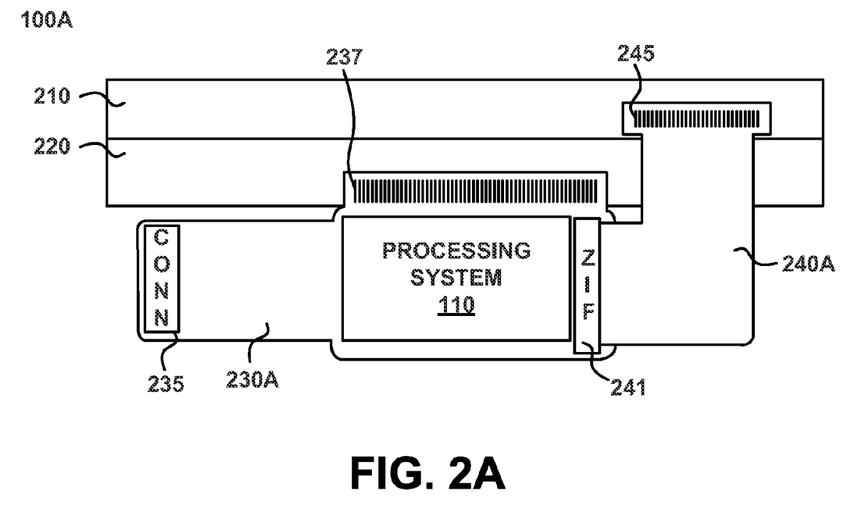
FIGS. 2A and 2B illustrate major components of transmitter pa is in two example input devices, in accordance with embodiments.
Figure 2B:
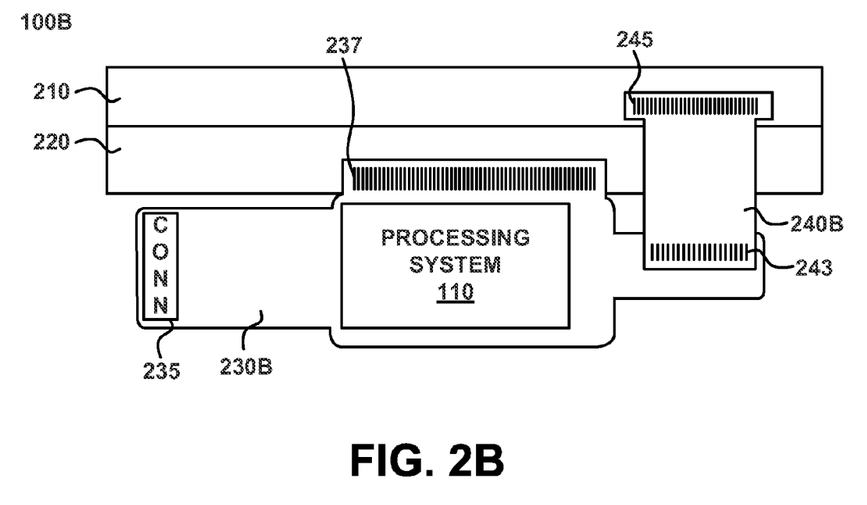

FIGS. 2A and 2B illustrate major components of transmitter paths in two example input devices, in accordance with embodiments. Input device 100A is illustrated in FIG. 2A, while input device 100B is illustrated in FIG. 2B. Both of these input devices 100A and 100B are illustrated as being overlaid upon a display, however, embodiments described herein may be utilized, with input devices that are not implemented in conjunction with a display. In various embodiments, input devices 100A and 100B may share elements with the display. For example, transmitter electrodes 160 may be shared between an input device (100A or 100B) and the display, where the transmitter electrodes 160 are configured for both capacitive sensing and display updating. In one embodiment, a common voltage electrode (Vcom electrode) of the display is segmented to form transmitter electrodes 160. In other embodiments, elements of input devices 100A and 100B may be disposed within the display such as being disposed on a polarizer, color filter panel or other substrate of the display. In one embodiment, transmitter electrodes 160 and receive electrodes 170 may be disposed on a same layer of a substrate or on different layers of a substrate: the substrate overlaid upon a display.

Input device 100A includes a clear transcapacitive touch screen 210 that is configured with a sensor electrode pattern of transmitter electrodes 160 and receiver electrodes 170 (see e.g., FIG. 1B for one example of such a sensor electrode pattern). In many embodiments, the sensor electrodes are made of transparent materials and/or are only accessible on one end. As illustrated, touch screen 210 is disposed upon a glass shelf of a thin film transistor (TFT) glass 220 of a display. Processing system 110 is disposed, upon flexible printed circuit (FPC) board 230A. FPC 230A includes a connector 235 for connecting to other electronic devices electronic device 150), a connector 237 for coupling with components a display, and first portion (e.g., a socket) of a zero insertion force (ZIF) connection 241 for removably coupling with FPC 240A. FPC 240A includes a second portion (e.g., pins that are configured to fit into the ZIF socket) of ZIF connection 241, and a connector 245 that couples with transmitter electrodes 160 and receiver electrodes 170 of touch screen 210. Between the second portion of ZIF 241 and connector 245, FPC 240A includes traces that couple transmitter circuitry of processing system 110 with transmitter electrodes 160 and traces that couple receiver circuitry of processing system 110 with receiver electrodes 170. In FIG. 2A, components that make up a transmitter path include may include any one or more of: a transmitter circuit of processing system 110A, ZIF connection 241, a trace on flexible printed circuit 240A, connector 245, and a transmitter electrode (e.g., 160-1) on touch screen 210. It is appreciated that a short or open can occur at any location in this transmitter path, and that embodiments described herein may be utilized to diagnose the presence of a short or open and in some instances, the component with in the transmitter path where the short or open is located.

Input device 100B includes a clear transcapacitive touch screen 210 that is configured with a sensor electrode pattern of transmitter electrodes 160 and receiver electrodes 170 (see e.g., FIG. 1B thr one example of such a sensor electrode pattern). In many embodiments, the sensor electrodes are made of transparent materials and/or are only accessible on one end. As illustrated, touch screen 210 is disposed upon a glass shelf of a thin film transistor (TFT) glass 220 of a display. Processing system 110 is disposed upon flexible printed circuit (ITC) board 230B. FPC 230B includes a connector 235 for connecting to other electronic devices (e.g., electronic device 150), a connector 237 for coupling with components a display, and pads (not visible) to which a soldered hot bar connection is made for coupling with FPC 240B. FPC 240B includes hot bar connector 243, and a connector 245 that couples with transmitter electrodes 160 and receiver electrodes 170 of touch screen 210. Between hot bar connector 243 and connector 245, FPC 240B includes traces that couple transmitter circuitry of processing system 110 with transmitter electrodes 160 and traces that couple receiver circuitry of processing system 110 with receiver electrodes 170. In FIG. 2B, components that make up a transmitter path may include any one or more of: a transmitter circuit of processing system 110A, hot bar connector 243, a trace on flexible printed circuit 240B, connector 245, and a transmitter electrode (e.g., 160-1) on touch screen 210. It is appreciated that a short or open can occur at any location in this transmitter path, and that embodiments described herein may be utilized to diagnose the presence of a short or open and in some instances, the component within the transmitter path where the short or open is located.

Example Processing System

Figure 3:
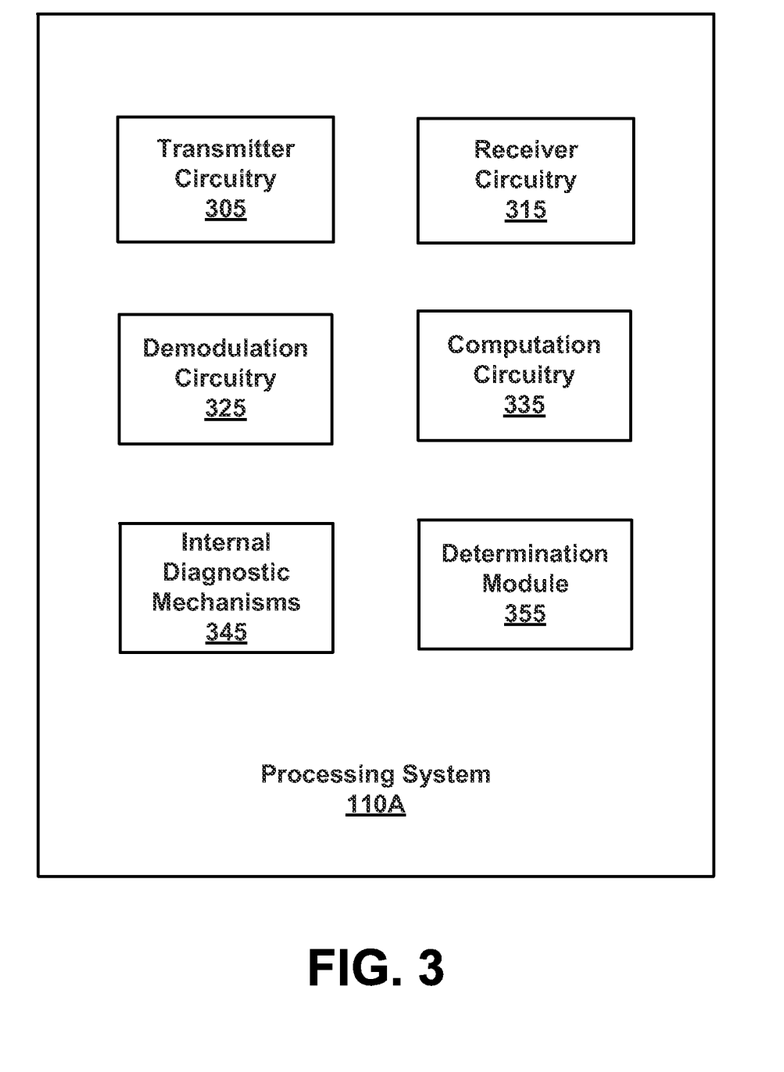
FIG. 3 illustrates an example processing system which may be utilized with an input device, according to various embodiments.

FIG. 3 illustrates an example processing system 110A which may be utilized with an input device (e.g., input device 100), according to various embodiments. Processing system 110A may be implemented with one or more ASICs, one or more ICs, one or more controllers, or some combination thereof. In one embodiment, processing system 110A is communicatively coupled with a plurality of transmitter and a plurality of receiver electrodes that implement a sensing region 120 of an input device 100. In one embodiment, of input device 100, processing system 110A includes transmitter circuitry 305, receiver circuitry 315, demodulation circuitry 325, computation circuitry 335, internal diagnostic mechanisms 345, and determination module 355. In some embodiments, processing system 110A and the input device 100, of which it is a part, may be disposed in or communicatively coupled with an electronic device 150, such as a display device, computer, or other electronic device.

Transmitter circuitry 305 operates to transmit transmitter signals on one or more transmitter electrodes 160. The signals that are transmitted on the transmitter electrodes each travel to a respective transmitter electrode by way of a transmitter path. In one embodiment the transmitter electrode is part of the transmitter path. Various embodiments of transmitter paths have been previously described in conjunction with FIGS. 1C, 2A and 2B. In a given time interval, transmitter circuitry 305 may transmit a transmitter signal (waveform) on one or more of a plurality of transmitter electrodes 160. Transmitter circuitry 305 may also be utilized to couple one or more transmitter electrodes 160 (and respective transmitter path(s)) of a plurality of transmitter electrodes 160 to high impedance, ground, or to a constant voltage when not transmitting a waveform on such transmitter electrodes. The transmitter signal may be a square wave, trapezoidal wave, or some other waveform.

Receiver circuitry 315 operates to receive resulting signals, via receiver electrodes. The received resulting signals correspond to and include some version of the transmitter signal(s) transmitted via the transmitter electrodes. These transmitted transmitter signals however, may be altered or changed in the resulting signal due to stray capacitance, noise, interference, and/or circuit imperfections among other factors, and thus may differ slightly or greatly from their transmitted versions. Resulting signals may be received on one or a plurality of receiver electrodes during a time interval.

Demodulation circuitry 325 operates to demodulate the received resulting signals that are acquired from one or more receiver electrodes 170. In one embodiment, the resulting signals are or may be affected by user input. For example, the received resulting signal may be affected in amplitude, phase or frequency by a user input such as placing an input object 140 within sensing region 120.

Computation circuitry 335 operates to compute/determine a measurement of a change in transcapacitive coupling between a transmitter electrode and a receiver electrode. Computation circuitry 335 then uses this measurement of change in transcapacitive coupling to determine the positional information of an input object (if any) with respect to sensing region 120, in one embodiment, the measurement of change is determined based on the demodulated output that is acquired by demodulation circuitry 325.

Figure 4:
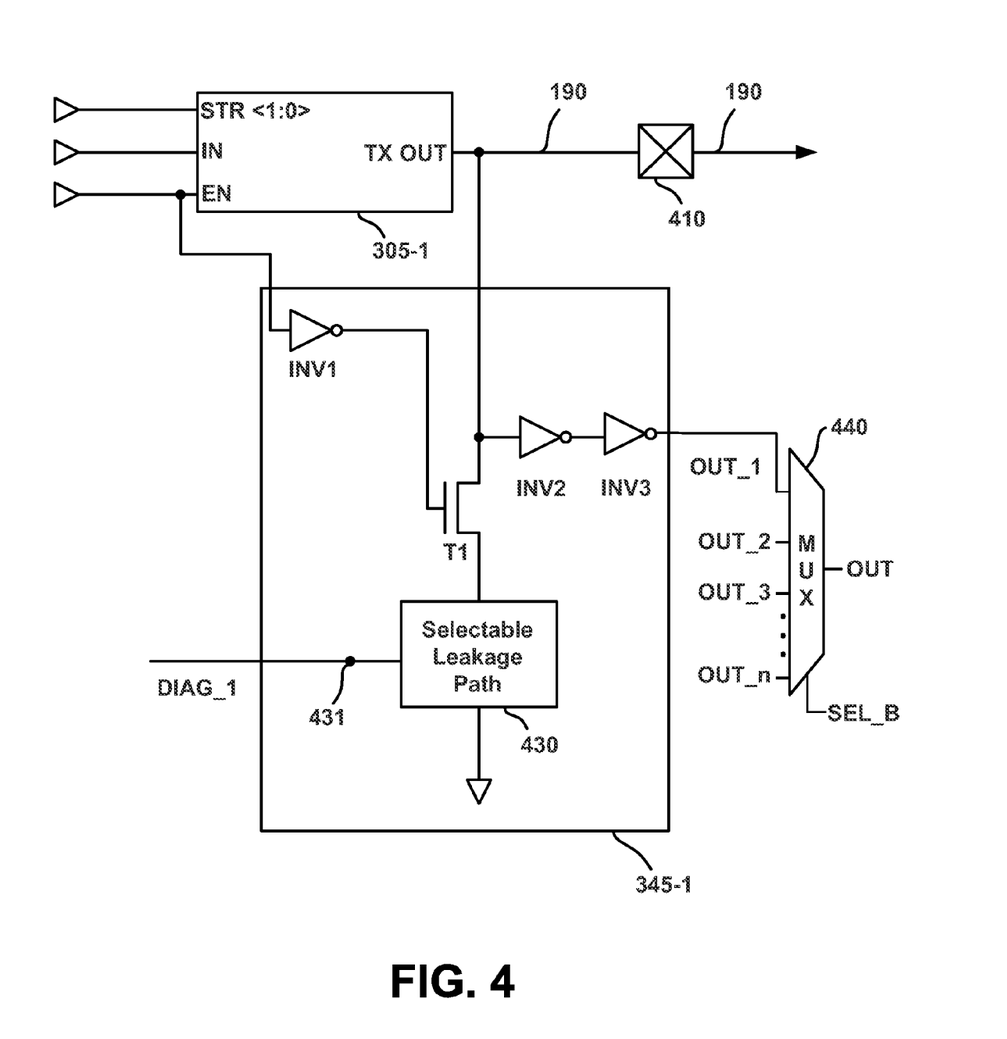
FIG. 4 illustrates an internal diagnostic mechanism coupled with a transmitter circuit, in accordance with an embodiment.

Internal diagnostic mechanisms 345 include one or more internal diagnostic mechanisms (e.g., 345-1 of FIG. 4). For example, in one embodiment, each transmitter circuit (e.g. 305-1 of FIG. 4) of transmitter circuitry 305 may be configured with its own diagnostic mechanism in the manner illustrated in FIG. 4. Internal diagnostic mechanisms 345 are employed by processing system 1104 to monitor transmitter paths and to establish selectable weak leakage paths that are coupled to transmitter paths. For example, a selectable leakage path can be selected in order to discharge a charge that has been driven onto a transmitter path. An output of an internal diagnostic mechanism which is coupled with a particular transmitter path can be monitored to measure any charge or signal on the transmitter path with which it is coupled. Functioning of internal diagnostic mechanisms 345 will be described in greater detail in conjunction with discussion of FIG. 4. In one embodiment, internal diagnostic mechanisms 345 are disposed on the same piece of silicon as part of the same integrated circuit as transmitter circuitry 305, thus eliminating the need for external testing appliances.

Determination module 355 receives output(s) from one or more internal diagnostic mechanisms 345 and utilizes the outputs to determine whether a discontinuity (open) or an ohmic coupling (i.e., a short of some level) exists in one or more of the transmitter paths of an input device and, in some instances, to determine where in a particular transmitter path (e.g. which component in the transmitter path) that an open exists. Determining the presence of an open or a short prevents a defective input device from exiting a production cycle, as it can be either disposed of or repaired. Furthermore, determining the component within the transmitter path that in which an open exists can facilitate a decision on repair or disposal. For instance, if the open is determined to be within the transmitter electrodes of a touch screen or touch pad, the touch screen/touch pad will often be disposed of because it is too difficult to fix, however the other components in the transmitter path may be saved and reused. Similarly, if the open is determined to be elsewhere within the input device (not in the touch screen/touch pad), the touch screen/touch pad can be kept while one or more other components are replaced, resoldered, reseated, or reconnected.

Example Internal Diagnostic Mechanism

FIG. 4 illustrates an internal diagnostic mechanism 345-1 coupled with a transmitter circuit 305-1, in accordance with an embodiment. In one embodiment, internal diagnostic mechanism 345-1 is disposed on the same piece of silicon as transmitter circuit 305-1, thus eliminating the need for an external testing appliance. In various embodiments, as only a few components are needed to implement internal diagnostic mechanism 345-1, this is a very minimal addition to an overall ASIC or other integrated circuit.

Transmitter circuit 305-1 is, in one embodiment, a tri-state digital driver that transmits an input (IN) signal and provides this signal at output (TX OUT) and onto transmitter path 190 (only a portion shown) in response to being enabled with an enable signal (EN). In one embodiment, transmitter circuit 305-1 is operable to drive the output (TX OUT) and thus transmitter path 190 at a selectable drive level or strength based upon a strength input received at STR. In one embodiment, transmitter circuit 305-1 is operable to drive the output (TX OUT) and thus transmitter path 190 at a selectable speed or slew rate. Additionally, in the absence of an enable signal on EN, the output of TX OUT goes into a tri-state mode that maintains transmitter path 190 at a high impedance. It is appreciated that an input device may have one or more transmitter circuits, such as transmitter circuit 305-1. For example, in one embodiment, there may be one or more transmitter circuits such as 305-1 coupled to each transmitter electrode (e.g., transmitter electrode 160-1) of an input device. Connector 410 is a conductive connector of an ASIC, controller, or other integrated circuit in which transmitter circuit 305-1 is disposed.

Internal diagnostic mechanism 345-1 includes a buffered output OUT_1 that is coupled to the output, TX OUT, of transmitter circuit 305-1. As depicted, buffering is provided by two series inverters INV1 and INV2. It is appreciated that other mechanisms may provide suitable buffering. In one embodiment, OUT_1 is provided to determination module 355. As illustrated, in one embodiment, this may comprise a plurality of outputs OUT_1, OUT_2, OUT_3, . . . OUT_n) from each of a plurality of internal diagnostic mechanisms 345 being multiplexed together by multiplexer 440 into a single output line, OUT, that can be selected such by determination module 355 by providing a selection signal SEL_B, to multiplexer 440.

Internal diagnostic mechanism 345-1 also includes a selectable leakage path 430 that can be selected with a diagnostic signal DIAG_1, which comprises an input select signal on selectable diagnostic node 431 of selectable leakage path 430. Selectable leakage path 430 couples transmitter path 190 to ground through transistor T1. As illustrated, the gate of transistor T1 is coupled through an inverter, INV1, to the enable input, EN, of transmitter circuit 305-1. In one embodiment, selectable leakage path 430 is only active when two selection mechanisms are both enabled. In various embodiments, the first selection mechanism, T1, is enabled when EN is low (not enabled). The second selection mechanism, selectable diagnostic node 431, is enabled when DIAG_1 is enabled (high). Selectable leakage path 430 may be formed in a number of ways, such as with a selectable current source or with a selectable weak pull-down transistor disposed in series between transistor T1 and ground.

Selectable leakage path 430 is a weak leakage path, where the term "weak" means that the path is weak enough that a fully charged nominal (not shorted or open) transmitter path 190 can be sampled a plurality of times before being discharged. In one embodiment, being discharged may be represented by logic zero. The relative weakness is selected such that a desired granularity is provided by the number of nominal condition (no shorts or opens) samples which should be able to be obtained. For example, in one embodiment, selectable leakage path 430 may be designed to provide 10 nominal samplings (a very coarse granularity) spaced at 10 nanosecond intervals prior to fully discharging a fully charge transmitter path 190. Ten samplings may provide sufficient granularity in an embodiment where it is only desired to determine if an open exists in transmitter path 190. In another embodiment, selectable leakage path 430 may be designed to provide 100 nominal samplings (a finer granularity than ten samples) spaced at 10 nanosecond intervals prior to fully discharging a fully charged transmitter path 190. One hundred samplings may provide sufficient granularity in an embodiment where it is desired to determine if an open exists in transmitter path 190 and to further to estimate which component in transmitter path in which the open is located. By a sample, what is meant is that the output, OUT_1, is strobed and measured while the leakage path is enabled. The output is repeatedly strobed and measured at known, defined intervals (e.g., every 10 nanoseconds) until a strobed output of transmitter path 190 is measured as completely discharged. In one embodiment, completely discharged is represented as logic zero. Each strobing and measurement constitutes a sample. In this manner, both the time (discharge rate) and number of samples that it takes to reach fall discharge can be measured by determination module 355.

In one embodiment, the signal DIAG_1 is provided by determination module 355 or some other portion of processing system 110A. In one embodiment, the signal DIAG_1 may be provided simultaneously to multiple internal diagnostic mechanisms. In one other embodiment, a diagnostic input, is provided to a demultiplexer and is routed as a particular diagnostic signal to any of a plurality of internal diagnostic mechanisms. This is accomplished by demultiplexing the DIAG signal to a selected internal diagnostic mechanism in response to a selection signal. In various embodiments, such demultiplexing allows for only a few signal lines to be utilized in order for processing system 1104 to direct input select signals to respective selectable leakage paths of a large number of internal diagnostic mechanisms.

Detecting Discontinuity

Determination module 355 can determine if a discontinuity exists along a transmitter path based upon a measurement of a discharge rate of the transmitter path during a time period that occurs after it has been charged by transmitter circuitry 305. This is because the discharge rate will be longer for greater capacitance and shorter for lesser capacitance, and because the amount of capacitance loading is directly correlated to the length of a transmitter path. For example transmitter circuit 305-1 fully charges transmitter path 190 during a first time period and is then disabled during a second time period. In one embodiment, during the first time period, an enable signal sent to internal diagnostic mechanism 345-1. During the second time period, internal diagnostic mechanism 345-1 and determination module 355 are utilized to measure the discharge rate of transmitter path 190. By comparing the discharge rate of transmitter path 190 with a predetermined discharge rate threshold value or range of values for transmitter path 190, determination module 355 can determine if transmitter path 190 has an open, as the discharge rate will be shorter than a nominal discharge rate threshold value if there is an open in the transmitter path, and will be progressively shorter than the nominal discharge rate threshold value the closer that the open is located to transmitter circuit 305-1. This discharge rate will grow shorter as the open is nearer transmitter circuit 305-1, because the open will cause the transmitter path to be shorter than normal and thus its capacitive loading (in response to being driven) to be progressively less than that of a nominal transmitter path 190.

In some embodiments a predetermined discharge rate threshold value (or range of values) to which a measured discharge rate is compared can be determined from empirical data measured on a similar, nominal (no shorts or opens) transmitter path or can be modeled data for a similar, nominal transmitter path. Likewise, additional predetermined threshold values/ranges that are associated with location of an open in a particular component or location on a transmitter path can be similarly determined from empirical or modeled data. In a manufacturing situation, such predetermined thresholds or ranges can be established once and utilized when testing numerous components (i.e., hundreds, thousands, or millions) in a production run.

Detecting Ohmic Coupling

Determination module 355 can also use internal diagnostic mechanism 345-1 and/or similar internal diagnostic mechanisms 345 that are coupled to other transmitter paths other than transmitter path 190 to determine if shorts exist between transmitter paths or between a transmitter path and a reference voltage of an input device.

in one embodiment, similar to where discontinuity testing is being accomplished (as described above) and where the capacitive loading is higher than expected (e.g. the discharge rate is longer than expected based on modeled or empirical data for a nominal transmitter path) rather than lower, determination module 355 can determine that the a portion of the tested transmitter path is ohmically coupled (e.g., shorted to some extent) to a receiver path of the input device. In one embodiment, an electrical path includes a receiver electrode such as receiver electrode 170-1 and/or any elements coupled with receiver circuitry of processing system 110A, such as traces and corresponding connections. This determination can be made because it would take such shorting to create a longer path which can sustain the higher than nominal capacitive loading indicated by a longer than nominal discharge rate.

In one embodiment, while the first transmitter path 190 is being driven by transmitter circuitry 305 and other transmitter paths are held at a high impedance by transmitter circuitry 305, determination module 355 can measure the output from a second internal diagnostic mechanism that is coupled with a second transmitter path to determine if any of the driven signal bleeds over to the second transmitter path. If there is bleed over, then determination module 355 can determine that the first transmitter path is ohmically coupled (e.g., shorted) in some fashion to the second transmitter path. Similar measurements can be taken from the outputs of diagnostic mechanisms of a third or additional transmitter paths to determine if any of these other transmitter paths is shorted to the first transmitter path. In a further embodiment, an output of a first internal diagnostic mechanism (e.g., 345-1 of FIG. 4) which is coupled with a first transmitter path (e.g., transmitter path 190) can be sampled to determine if a short exists in the first transmitter path. This procedure involves driving the first transmitter path to a high value with the path's transmitter circuit (e.g., transmitter circuit 305-1) during a time period. If something less that the driven value is measured at the output of the first internal diagnostic mechanism while the driving is taking place, then determination module 355 determines that the transmitter path is shorted to ground or another transmitter path.

In another embodiment, to determine if first transmitter path 190 is ohmically coupled (e.g., shorted to some extent) to an adjacent (second) transmitter path, the second transmitter path can be driven by transmitter circuitry 305 with an opposite signal to the signal that is being driven on the first transmitter path. Determination module 355 determines that the first and second transmitter paths are ohmically coupled (shorted) if a value of zero is measured at the output, OUT_1, of the first internal diagnostic mechanism 345-1 or at the output (e.g., OUT_2) of a second internal diagnostic mechanism that is coupled with the second transmitter path. This technique can be similarly carried out between the first transmitter path 190 and a third transmitter path where the third transmitter path is driven with a signal that is opposite of the signal driven on the first transmitter path, and an output value of zero is measured at the output, OUT_1, of the first internal diagnostic mechanism 345-1 or at the output (e.g., OUT_3) of a third internal diagnostic mechanism that is coupled with the third transmitter path. For example, transmitter path 190 may be a middle transmitter path with the second transmitter path adjacent on one side and the third transmitter path adjacent on another side. In other embodiments, the technique utilized to detect a short between first transmitter path 190 and a second transmitter path can be rolled through between first transmitter path 190 and each additional transmitter path of an input device. Similar tests can then be conducted between each possible paring of two transmitter paths in an input device.

Figure 5A:
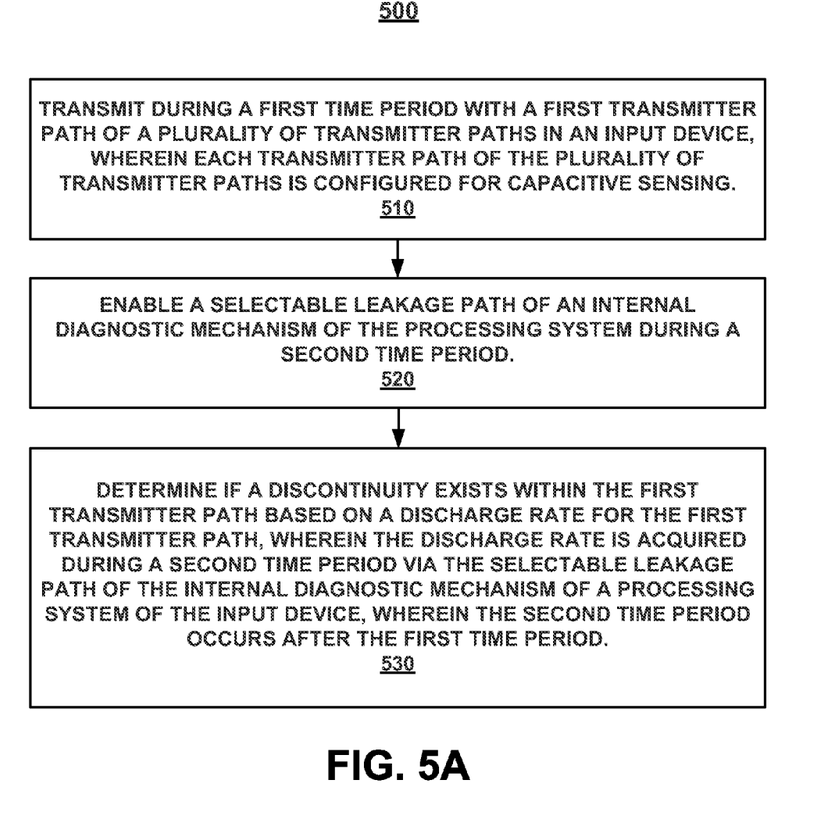
FIGS. 5A, 5B, and 5C illustrate a flow diagram of an example method of input device transmitter path error diagnosis, in accordance with embodiments.
Figure 5B:
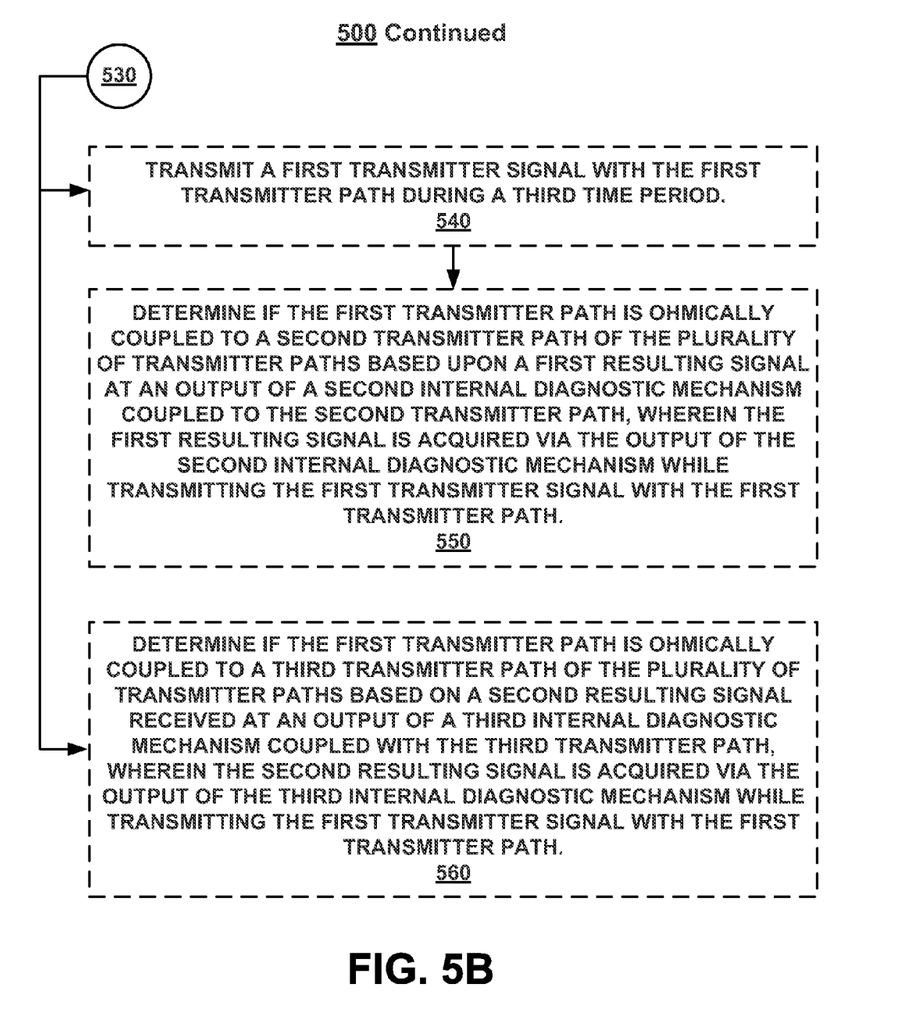
Figure 5C:
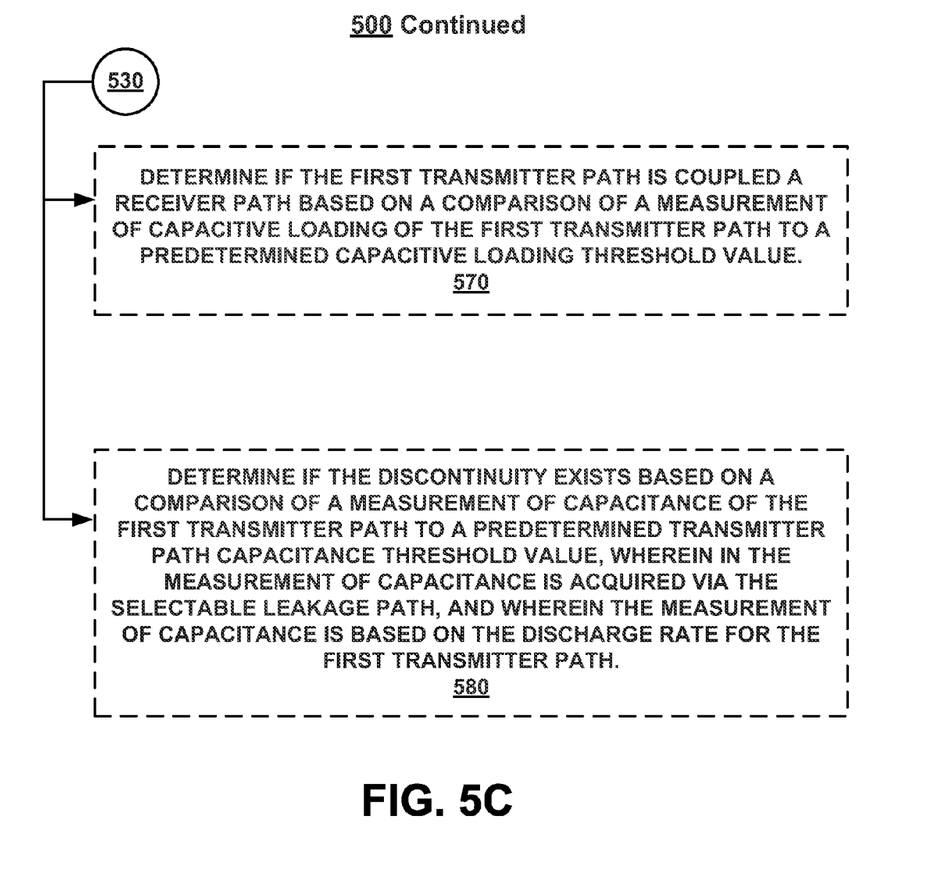

In yet another embodiment, to determine if first transmitter path 190 is ohmically coupled (e.g., shorted to some extent) to a reference potential, a transmitter signal is transmitted on transmitter path 190 by transmitter circuit 305-1. While the transmitter signal is being transmitted, other transmitter paths are maintained at a high impedance and determination module 355 selects or enables the output of first internal diagnostic mechanism 345-1 so that it may measure the resulting signal at the output, OUT_1. From this sampled resulting signal at the output of internal diagnostic mechanism 345-1, determination module 355 determines if the first transmitter path is ohmically coupled to a reference potential (e.g., ground or some internal voltage of the) of the input device. For example, in one embodiment if the measured resulting signal is low (e.g., logic zero) it can be determined that the transmitter path has an ohmic coupling to a ground, and if the measured resulting signal is high (e.g., logic one) than expected it can be determined that the transmitter path is ohmically coupled to a reference voltage that is higher than ground potential. In another embodiment, if the measured resulting signal is lower than expected it can be determined that the transmitter path has an ohmic coupling to a ground, and if the measured resulting signal is higher than expected it can be determined that the transmitter path is ohmically coupled to a reference voltage that is higher than ground potential Example Method of Input Device Transmitter Path Error Diagnosis FIGS. 5A, 5B, and 5C illustrate a flow diagram of an example method of input device transmitter path error diagnosis, in accordance with embodiments. For purposes of illustration, during the description of flow diagram 500, reference will be made to components of processing system 110A of FIG. 3 and to transmitter circuit 305-1 and components of internal diagnostic circuit 345-1 of FIG. 4. In some embodiments, not all of the procedures described in flow diagram 500 are implemented. In some embodiments, other procedures in addition to those described may be implemented. In some embodiments, procedures described in flow diagram 500 may be implemented in a different order than illustrated and/or described.

At 510 of flow diagram 500, in one embodiment, the method transmits during a first time period with a first transmitter path of a plurality of transmitter paths in an input device. It is appreciated that the transmitter paths are each configured for capacitive sensing and thus each transmitter path includes a transmitter electrode such as transmitter electrode 160-1 of FIG. 1B. With reference to FIG. 4, in one embodiment, if transmitter path 190 is considered to be the first transmitter path, this comprises transmitter circuit 305-1 transmitting via TX OUT onto transmitter path 190.

At 520 of flow diagram 500, in one embodiment, a selectable leakage path of an internal diagnostic mechanism of the processing system is enabled during a second time period. The second time period is separate from and following the first time period. With further reference FIG. 4, in one embodiment, during the second time period EN becomes disabled, thus turning on transmitter T1 during the second time period. During this second time period processing system 1104 then provides an enabling in the form of DIAG_1 on node 431 in order to enable selectable leakage path 430.

At 530 of flow diagram 500, in one embodiment, it is determined if a discontinuity (i.e., an open) exists within the first transmitter path. For example, determination module 355 makes this determination based on a measured discharge rate for the first transmitter path. The discharge rate is acquired during a second time period via the selectable leakage path of the internal diagnostic mechanism (e.g., 345-1) of a processing system of the input device.

At 540 of flow diagram 500, in one embodiment, the method further includes transmitting a first transmitter signal with the first transmitter path during a third time period. The third time period may be the same as the first time period or may be later than the second time period. The transmitter signal may be a signal such as a square wave, trapezoidal wave, or some other waveform that is transmitted with the first transmitter path (e.g., transmitter path 190) by a transmitter circuit (e.g., transmitter circuit 305-1) of transmitter circuitry 305.

At 550 of flow diagram 500 while transmitting the first transmitter signal at procedure 540, in one embodiment, the method also determines if the first transmitter path is ohmically coupled to a second transmitter path of the plurality of transmitter paths. For example, determination module 355 makes this determination, in one embodiment, based upon a first resulting signal that is measured at an output of a second internal diagnostic mechanism coupled to the second transmitter path. The second resulting signal is acquired via the output of the second internal diagnostic mechanism while transmitting the first transmitter signal with the first transmitter path. It is appreciated that the second internal diagnostic mechanism is, in one embodiment, an identical circuit to that of first internal diagnostic mechanism 345-1 except that it is coupled with the second transmitter path, OUT_2, illustrated in FIG. 4, is an example of the output from such a second internal diagnostic mechanism.

At 560 of flow diagram 500, in one embodiment, the method further includes determining if the first transmitter path is ohmically coupled to a third transmitter path of the plurality of transmitter paths. Similarly to procedure 550, determination module 355 makes this determination, in one embodiment, based on a second resulting signal received at an output of a third internal diagnostic mechanism coupled with the third transmitter path. The second resulting signal is acquired via the output of the third internal diagnostic mechanism while transmitting the first transmitter signal with first transmitter path. It is appreciated that the third internal diagnostic mechanism is, in one embodiment, an identical circuit to that of first internal diagnostic mechanism 345-1 except that it is coupled with the third transmitter path. OUT_3, illustrated in FIG. 4, is an example of the output from such a third internal diagnostic mechanism. The second transmitter signal may be the same or different from the first transmitter signal, and may be a square wave, trapezoidal wave, or some other waveform.

At 570 of flow diagram 500, in one embodiment, the method as described in 510 through 530 further includes determining if the first transmitter path is ohmically coupled to a receiver path of the capacitive sensing device. Determination module 355 makes this determination, in one embodiment, based on a comparison of a measurement of capacitive loading of the first transmitter path to a predetermined capacitive loading threshold value. The predetermined capacitive loading threshold value may be acquired from empirical or modeled data, but is for a nominal (neither shorted nor open) version of the first transmitter path. The capacitive loading threshold may be expressed as a discharge rate or time that it should take to discharge the first transmitter path via a selectable leakage path of an internal diagnostic mechanism. If the actually measured capacitive loading is greater than the predetermined threshold by a predetermined margin (e.g., 1.0% or greater, as but one non-limiting example), then determination module 355 determines that the first transmitter path is shorted to a receiver path.

At 580 of flow diagram 500, in one embodiment, the method as described in 510 through 530 further includes determining if the discontinuity exists based on a comparison of a measurement of capacitance of the first transmitter path to a predetermined transmitter path capacitance threshold value. The measurement of capacitance is acquired via the selectable leakage path. For example, it is enabled and the output is strobed (sampled) repeatedly at regular intervals to determine a measure of capacitance indirectly by measuring the discharge rate (the time that it takes until the transmitter path is measured to be fully discharged or reach logic zero).

Thus, the embodiments and examples set forth herein were presented in order to best explain various selected embodiments of the present invention and its particular application and to thereby enable those skilled in the art to make and use embodiments of the invention. However, those skilled in the art will recognize that the foregoing description and examples have been presented for the purposes of illustration and example only. The description as set forth is not intended to be exhaustive or to limit the embodiments of the invention to the precise form disclosed.

What is claimed is:

1. A processing system configured for capacitive sensing, said processing system comprising:
    transmitter circuitry configured to transmit during a first time period with a first transmitter path of a plurality of transmitter paths in an input device, wherein each transmitter path of said plurality of transmitter paths is configured for capacitive sensing;
    a first internal diagnostic mechanism comprising:
        a selectable leakage path,
        a buffered output coupled with said selectable leakage path and said first transmitter path, and
        a selectable diagnostic node coupled as an input select of said selectable leakage path, wherein said selectable leakage path is configured to be coupled with said transmitter circuitry to intentionally discharge a charged portion of said transmitter circuitry with which said selectable leakage path is coupled; and
    a determination module configured to determine when a discontinuity exists within said first transmitter path based on a discharge rate for said first transmitter path, wherein said discharge rate is acquired during a second time period via said selectable leakage path of said first internal diagnostic mechanism, wherein said second time period occurs after said first time period.

2. The processing system of claim 1, wherein said selectable leakage path comprises:
    a first selection mechanism coupled with an enable input of said transmitter circuitry and configured for disabling said selectable leakage path when said transmitter circuitry is enabled for transmitting and enabling said selectable leakage path when said transmitter circuitry is not enabled for transmitting; and
    a second selection mechanism coupled in series with said first selection mechanism and configured for addressably enabling said selectable leakage path.

3. The processing system of claim 1, wherein said selectable leakage path comprises:
    one of a selectable weak pull-down transistor and a current source.

4. The processing system of claim 1, wherein said transmitter circuitry is further configured to:
    transmit a first transmitter signal with said first transmitter path during a third time period; and
    said determination module is further configured to determine when said first transmitter path is ohmically coupled to a second transmitter path of said plurality of transmitter paths based upon a first resulting signal at an output of a second internal diagnostic mechanism coupled with said second transmitter path, wherein said first resulting signal is acquired via said output of said second internal diagnostic mechanism while said transmitter circuitry transmits said first transmitter signal with said first transmitter path.

5. The processing system of claim 4, wherein said determination module is further configured to determine when said first transmitter path is ohmically coupled to a third transmitter path of said plurality of transmitter paths based on a second resulting signal at an output of a third internal diagnostic mechanism coupled with said third transmitter path, wherein said second resulting signal is acquired via said output of said third internal diagnostic mechanism while said transmitter circuitry transmits said first transmitter signal with said first transmitter path.

6. The processing system of claim 4, wherein said transmitter circuitry is further configured to transmit a second transmitter signal on said second transmitter path during said third time period, wherein said second transmitter signal is of opposite polarity to said first transmitter signal.

7. The processing system of claim 4, wherein said transmitter circuitry is further configured to:
   transmit a second transmitter signal during a fourth time period with said first transmitter path;
   said first internal diagnostic mechanism is further configured to enable an output of said first internal diagnostic mechanism; and
   said determination module is further configured to determine when said first transmitter path is ohmically coupled to a reference potential based on a measurement of a second resulting signal, wherein said second resulting signal is acquired via said output of said first internal diagnostic mechanism while said transmitter circuitry transmits said second transmitter signal with said second transmitter path.

8. The processing system of claim 1, wherein said determination module is further configured to determine when said first transmitter path is ohmically coupled to at least one receiver path of a capacitive sensing device based on a comparison of a measurement of capacitive loading of said first transmitter path to a predetermined capacitive loading threshold value.

9. The processing system of claim 1, wherein said determination module is further configured to determine when said discontinuity exists based on a comparison of a measurement of capacitance of said first transmitter path to a predetermined transmitter path capacitance threshold value, wherein said measurement of capacitance is acquired via said selectable leakage path and wherein said measurement of capacitance is based on said discharge rate for said first transmitter path.

10. A capacitive sensing device comprising:
    a plurality of transmitter paths, wherein each transmitter path of the plurality of transmitter paths is configured to for capacitive sensing; and
    a processing system coupled with said plurality of transmitter paths, said processing system configured to:
    transmit during a first time period with a first transmitter path of said plurality of transmitter paths;
    enable a selectable leakage path of a first internal diagnostic mechanism of said processing system during a second time period, said first internal diagnostic mechanism comprising said selectable leakage path, a buffered output coupled with said selectable leakage path and said first transmitter path, and a selectable diagnostic node coupled as an input select of said selectable leakage path, wherein responsive to enablement said selectable leakage path is configured to be coupled with said first transmitter path to intentionally discharge a charge accumulated on said first transmitter path; and
    determine when a discontinuity exists within said first transmitter path based on a discharge rate for said first transmitter path, wherein said discharge rate is acquired during a second time period via said selectable leakage path of said first internal diagnostic mechanism, and wherein said second time period occurs after said first time period.

11. The capacitive sensing device of claim 10, wherein said processing system is further configured to:
    transmit a first transmitter signal with said first transmitter path during a third time period; and
    determine when said first transmitter path is ohmically coupled to a second transmitter path of said plurality of transmitter paths based upon a first resulting signal at an output of a second internal diagnostic mechanism coupled to said second transmitter path, wherein said first resulting signal is acquired via said output of said second internal diagnostic mechanism while said processing system is transmitting said first transmitter signal with said first transmitter path.

12. The capacitive sensing device of claim 11, wherein said processing system is further configured to:
    determine when said first transmitter path is ohmically coupled to a third transmitter path of the plurality of transmitter paths based on a second resulting signal received at an output of a third internal diagnostic mechanism coupled with said third transmitter path, wherein said second resulting signal is acquired via said output of said third internal diagnostic mechanism and while said processing system is transmitting said first transmitter signal during said third time period with said first transmitter path.

13. The capacitive sensing device of claim 10, wherein said processing system is further configured to determine when said first transmitter path is ohmically coupled to at least one receiver path of said capacitive sensing device based on a comparison of a measurement of capacitive loading of said first transmitter path to a predetermined capacitive loading threshold value.

14. The capacitive sensing device of claim 10, wherein said processing system is further configured to determine when said discontinuity exists based on a comparison of a measurement of capacitance of said first transmitter path to a predetermined transmitter path capacitance threshold value, wherein in said measurement of capacitance is acquired via said selectable leakage path, and wherein said measurement of capacitance is based on said discharge rate for said first transmitter path.

15. A method of input device transmitter path error diagnosis, said method comprising:
    transmitting during a first time period with a first transmitter path of a plurality of transmitter paths in an input device, wherein each transmitter path of said plurality of transmitter paths is configured for capacitive sensing;
    enabling a selectable leakage path of an internal diagnostic mechanism of a processing system during a second time period, said internal diagnostic mechanism comprising said selectable leakage path, a buffered output coupled with said selectable leakage path and said first transmitter path, and a selectable diagnostic node coupled as an input select of said selectable leakage path, wherein responsive to enablement said selectable leakage path is configured to intentionally discharge a charge accumulated on said first transmitter path; and
    determining when a discontinuity exists within said first transmitter path based on a discharge rate for said first transmitter path, wherein said discharge rate is acquired during a second time period via said selectable leakage path of said internal diagnostic mechanism of said processing system of said input device, wherein said second time period occurs after said first time period.

16. The method as recited in claim 15, further comprising:
    transmitting a first transmitter signal with said first transmitter path during a third time period; and
    determining when said first transmitter path is ohmically coupled to a second transmitter path of said plurality of transmitter paths based upon a first resulting signal at an output of a second internal diagnostic mechanism coupled to said second transmitter path, wherein said first resulting signal is acquired via said output of said second internal diagnostic mechanism while transmitting said first transmitter signal with said first transmitter path.

17. The method as recited in claim 16, further comprising:
determining when said first transmitter path is ohmically coupled to a third transmitter path of said plurality of transmitter paths based on a second resulting signal received at an output of a third internal diagnostic mechanism coupled with said third transmitter path, wherein said second resulting signal is acquired via said output of said third internal diagnostic mechanism while transmitting said first transmitter signal with said first transmitter path.

18. The method as recited in claim 15, further comprising:
determining when said first transmitter path is ohmically coupled to a receiver path based on a comparison of a measurement of capacitive loading of said first transmitter path to a predetermined capacitive loading threshold value.

19. The method as recited in claim 15, further comprising:
determining when said discontinuity exists based on a comparison of a measurement of capacitance of said first transmitter path to a predetermined transmitter path capacitance threshold value, wherein in said measurement of capacitance is acquired via said selectable leakage path, and wherein said measurement of capacitance is based on said discharge rate for said first transmitter path.

* * * * *